(12) United States Patent
Kwasniewski et al.

(10) Patent No.: US 7,414,484 B2
(45) Date of Patent: Aug. 19, 2008

(54) VOLTAGE CONTROLLED OSCILLATOR CIRCUITRY AND METHODS

(75) Inventors: Tad Kwasniewski, Ottawa (CA); William Bereza, Nepean (CA); Shoujun Wang, Kanata (CA); Muhammad Usama, Nepean (CA)

(73) Assignee: Altera Corporation, San Jose, CA (US)

( * ) Notice: Subject to any disclaimer, the term of this patent is extended or adjusted under 35 U.S.C. 154(b) by 72 days.

(21) Appl. No.: 11/241,295

(22) Filed: Sep. 29, 2005

(65) Prior Publication Data

US 2007/0069831 A1 Mar. 29, 2007

(51) Int. Cl.
H03B 27/00 (2006.01)

(52) U.S. Cl. .............................. 331/45; 331/74; 331/57

(58) Field of Classification Search .................. 331/57, 331/74, 45
See application file for complete search history.

(56) References Cited

U.S. PATENT DOCUMENTS

| | | | |
|---|---|---|---|
| 6,549,082 B2 * | 4/2003 | Ipek et al. ..................... 331/57 |
| 6,972,635 B2 * | 12/2005 | McCorquodale et al. ..... 331/167 |
| 7,019,598 B2 * | 3/2006 | Duncan et al. ............... 331/176 |
| 7,034,626 B2 * | 4/2006 | Akeyama et al. ........ 331/117 FE |

OTHER PUBLICATIONS

Yalcin Alper Eken and John P. Uyemura, "The design of a 14GHz I/Q ring oscillator in 0.18 um CMOS", IEEE ISCAS 2004, vol. 4, May 2004.

In-Chul Hwang, Chulwoo Kim and Sung-Mo (Steve) Kang, "A CMOS Self-Regulating VCO With Low Supply Sensitivity", IEEE Journal of Solid-State Circuits, vol. 39, No. 1, Jan. 2004.

Markus Grozing, Bernd Philipp and Manfred Berroth, "CMOS Ring Oscillator with Quadrature Outputs and 100 MHz to 3.5 GHz Tuning Range", 29th European Solid-State Circuits Conference, Sep. 2003.

William Shing Tak Yan and Howard Cam Luong, "A 900-MHz CMOS Low-Phase-Noise Voltage-Controlled Ring Oscillator", IEEE Transactions on Circuits And Systems-II: Analog and Digital Signal Processing, vol. 48, No. 2, Feb. 2001.

Dean A. Badillo, Sayfe Kiaei, "Comparison of Contemporary CMOS Ring Oscillator", IEEE Radio Frequency Integrated Circuits Symposium, 2004.

M.A.T. Sanduleanu, D. van Goor and H. Veenstra, "Octave Tunable, Highly Linear, RC-Ring Oscillator with Differential Fine-Coarse Tuning, Quadrature Outputs and Amplitude Control for Fiber Optic Transceivers", IEEE Radio Frequency Integrated Circuits Symposium, 2002.

(Continued)

*Primary Examiner*—Arnold Kinkead
(74) *Attorney, Agent, or Firm*—Matthew S. Bertenthal; Ropes & Gray LLP

(57) ABSTRACT

Voltage controlled oscillator ("VCO") circuitry includes LC tank or ring VCO circuitry and frequency divider circuitry that divides the frequency output by the oscillator circuitry by a selectable integer factor that is at least 2 in the case of a ring oscillator or at least 4 in the case of an LC tank oscillator. This arrangement allows the oscillator circuitry to operate at frequencies that are higher than the desired final output frequencies, which has such advantages as reducing the size and power consumption of the oscillator circuitry, and allowing the circuitry as a whole to have a wide range of operating frequencies while reducing the frequency range over which the oscillator circuitry may be required to operate.

18 Claims, 11 Drawing Sheets

OTHER PUBLICATIONS

Afshin Rezayee and Ken Martin, "A Coupled Two-Stage Ring Oscillator", IEEE Midwest Symposium on Circuits and Systems, 2001.

Neric H. W. Fong, et al., "Design of wide-band CMOS VCO for multiband wireless LAN applications", IEEE Journal of Solid-State Circuits, vol. 38, No. 8, Aug. 2003.

Zhenbiao Li and Kenneth O., "A 900-MHz 1.5-V CMOS voltage controlled oscillator using switched resonators with a wide tuning range", IEEE Microwave and Wireless Components Letters, vol. 13, No. 4, Apr. 2003.

J.J. Kim, Y. Lee and S.B. Park, "Low noise CMOS LC oscillator with dual-ring structure", IEE Electronics Letters vol. 40, No. 17, Aug. 2004.

Yalcin Alper Eken and John P. Uyemura, "Multiple-GHz Ring and LC VCOs in 1.18 um CMOS", IEEE Radio Frequency Integrated Circuits Symposium 2004.

Kostas Manetakis, Darryl Jessie and Chiewcharn Narathong, "A CMOS VCO with 48% Tuning Range for Modern Broadband Systems", IEEE Custom Integrated Circuits Conference 2004.

Peter Vancorenland and Michiel S. J. Steyaert, "A 1.57-GHz fully integrated very low phase-noise quadrature VCO", IEEE Journal of Solid-State Circuits, vol. 37, No. 5, May 2002.

Axel D. Berny, Ali M. Niknejad and Robert G. Meyer, "A wideband low-phase-noise CMOS VCO", IEEE Custom Integrated Circuits Conference 2003.

Paavo Vaananen, Mikko Metsanvirta and Nikolay T. Tchamov, "A 4.3-GHz VCO with 2-GHz Tuning Range and low phase noise", IEEE Journal of Solid-State Circuits, vol. 36, No. 1, Jan. 2001.

* cited by examiner

US 7,414,484 B2

VOLTAGE CONTROLLED OSCILLATOR CIRCUITRY AND METHODS

BACKGROUND OF THE INVENTION

This invention relates to voltage controlled oscillator ("VCO") circuitry and to methods of operating such circuitry.

Frequently desired attributes of VCO circuitry include (1) ability to operate over a wide range of frequencies (sometimes including frequencies that are quite high (e.g., in the gigahertz range)), (2) low phase noise ("jitter") at all operating frequencies, (3) low power consumption, and (4) small area requirement on an integrated circuit. To limit a VCO's power consumption, it is typical to operate it at a frequency equal to the desired output frequency (no frequency division of the VCO signal) or at half the desired frequency when quadrature outputs are used for half-rate architectures. Again, this preference to operate at the lowest frequency possible is justified by a desire to limit the oscillator's power consumption. However, low frequency operation may inconsistent with the above-mentioned possible objective of small integrated circuit area being required for the VCO.

Known VCO circuits that employ LC (inductor/capacitor) tank circuits tend to have relatively low phase noise, but are operable over only quite narrow frequency ranges. LC tank circuits that operate at relatively low frequencies are especially large users of area on an integrated circuit. Known VCO circuits that employ ring oscillators may be operable over somewhat wider frequency ranges. However, these VCOs tend to have relatively high phase noise.

SUMMARY OF THE INVENTION

In accordance with this invention, VCO circuitry includes an oscillator circuit (typically a narrowband oscillator circuit) operating at a frequency higher than the desired output frequency of the VCO. For example, if the oscillator circuit is a ring oscillator, the oscillator may operate at a frequency that is at least twice the desired output frequency of the VCO. If the oscillator circuit is an LC tank oscillator, the oscillator may operate at a frequency that is at least four times the desired output frequency of the VCO. The output signal of the oscillator circuit is divided by a factor that is at least 2 in the case of a ring oscillator or at least 4 in the case of an LC tank oscillator to produce one or more VCO output signals. The factor by which the oscillator frequency is divided is preferably selectable from several integer values (e.g., 2, 3, 4, 5, . . ., in the case of a ring oscillator, or 4, 5, 6, 7, . . . , in the case of an LC tank oscillator).

More specifically, in an illustrative embodiment employing an LC tank oscillator, the LC tank circuitry preferably produces four signals that are in phase quadrature. The frequency of each of these signals is first divided by two. The resulting frequency-divided quadrature signals are applied to further frequency modifying circuitry (e.g., logic circuitry) that can select among features of the applied signals to effectively synthesize one or more final VCO output signals having frequency that can be any of several different integer fractions of the LC tank circuitry frequency (e.g., the LC tank circuitry frequency divided by 4, 5, 6, 7, or 8, etc.). In this way, although the LC tank circuitry can be operated in a single relatively narrow frequency band or range, the operating frequency range of the VCO as a whole can be greatly extended by controlling the selections made by the logic circuitry. For example, relatively fine adjustments of the frequency of the VCO can be made by adjusting the frequency of the LC tank circuitry. Relatively coarse adjustments of the frequency of the VCO can be made by changing the selections made by the logic circuitry.

An alternative illustrative embodiment employs ring oscillator circuitry instead of LC tank oscillator circuitry. In other respects such ring oscillator embodiments may be similar to what is described above for LC tank oscillator embodiments, except that the overall frequency division may be by a factor of 2, 3, 4, 5, 6, etc. This possible difference between LC tank and ring oscillator embodiments may be due to either or both of two considerations. First, LC tank oscillator circuits tend to be operable at higher frequencies than ring oscillator circuits. Second, ring oscillator circuits tend to be operable over a wider frequency range than LC tank oscillator circuits. This second consideration may make it possible for a ring oscillator embodiment to change from a frequency division factor of 2 to a frequency division factor of 3 without leaving a gap in the operating frequency range supported by the VCO as a whole. Such a change in frequency division factor may be too large for an LC tank oscillator VCO, without leaving a gap in the supported operating frequency range. On the other hand, a change from dividing by 4 to dividing by 5 is a much smaller percentage change (than from 2 to 3), and therefore a change that an LC tank oscillator VCO can allow without creating a gap in the supported operating frequency range.

Another aspect of the invention relates to use of VCO circuitry in accordance with the invention to provide circuitry for delaying a signal.

Further features of the invention, its nature and various advantages, will be more apparent from the accompanying drawings and the following detailed description of the preferred embodiments.

DETAILED DESCRIPTION

The invention will first be described in detail below primarily with reference to an illustrative embodiment that employs LC tank oscillator circuitry. Thereafter, an alternative embodiment that employs ring oscillator circuitry will be described.

Figure 1:
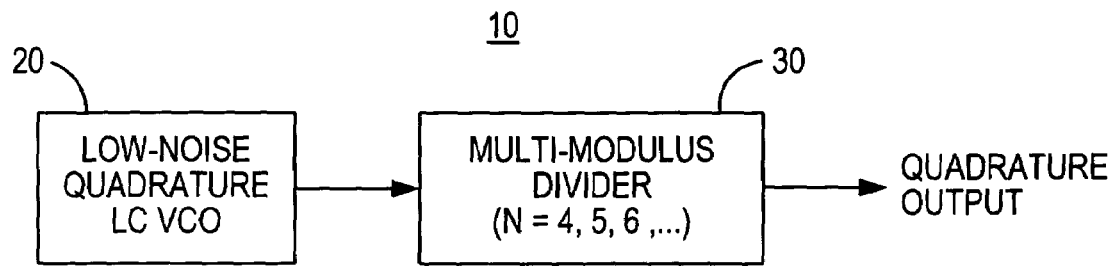
FIG. 1 is a simplified block diagram of an illustrative embodiment of circuitry constructed in accordance with the invention.

FIG. 1 shows an illustrative embodiment of VCO circuitry 10 in accordance with the invention. VCO circuitry 10 includes LC tank VCO circuitry 20 and multi-modulus divider circuitry 30. Although all frequencies mentioned herein are merely illustrative, and other frequencies can be used instead if desired, a typical operating range for LC tank VCO circuitry 20 may be in the range from about 15 GHz to about 20 GHz. At these high frequencies, the components of circuitry 20 (especially the inductor or inductors) can be quite small on an integrated circuit, and the power consumption of the circuit can also be quite small. As an example, a 20 GHz LC tank inductor may be only about one-sixteenth the size of a 5 GHz LC tank inductor.

Figure 2:
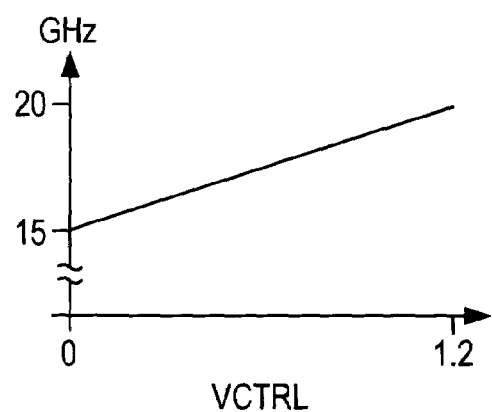
FIG. 2 is a simplified graph of frequency vs. control voltage that is useful in explaining certain aspects of the invention.

FIG. 2 shows typical operation of circuitry 20 in response to a control signal VCTRL. In particular, the frequency of operation of circuitry 20 varies from about 15 GHz to about 20 GHz as VCTRL varies from about 0 volts to about 1.2 volts.

Figure 3:
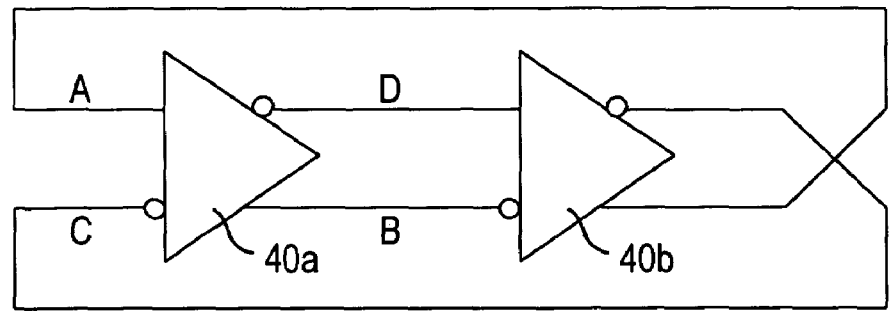
FIG. 3 is a more detailed, but still simplified, schematic block diagram of an illustrative embodiment of a portion of circuitry of the type shown in FIG. 1 in accordance with the invention.
Figure 4:
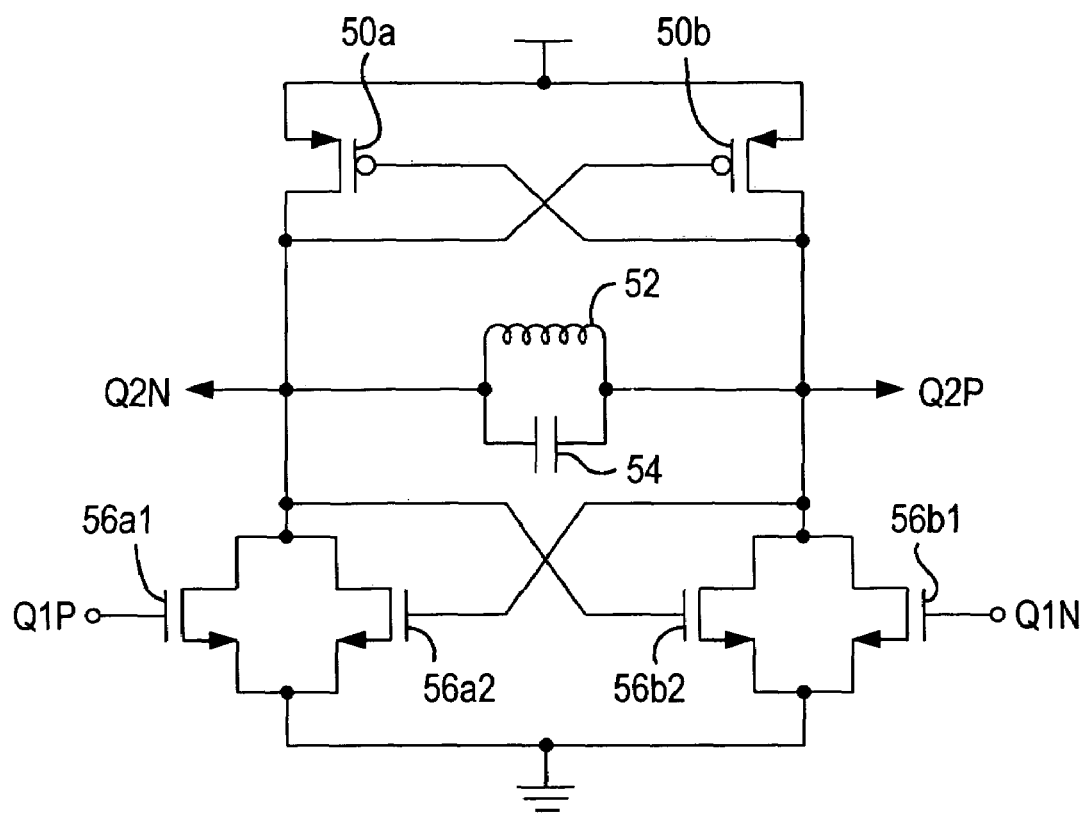
FIG. 4 is a schematic diagram of an illustrative embodiment of a representative portion of circuitry of the type shown in FIG. 3.

FIG. 3 shows an illustrative embodiment of circuitry 20 in more detail. As shown in FIG. 3, circuitry 20 includes a two-stage coupled quadrature tank oscillator 40a/40b. An illustrative embodiment of a representative one of the stages 40 of the FIG. 3 circuitry is shown in more detail in FIG. 4. As shown in FIG. 4, representative stage 40 includes PMOS transistors 50a and 50b, inductor 52, capacitor 54, and NMOS transistors 56a1, 56a2, 56b1, and 56b2. Input Q1P is applied to the gate of transistor 56a1. Input Q1N is applied to the gate of transistor 56b1. Output Q2N is connected to a node at one "end" of the LC tank circuit 52/54. Output Q2P is connected to a node at the other "end" of the LC tank circuit. VCTRL is used to control either a variable capacitor (54) or a variable current source (not shown) connected between the VCO and supply (drains of transistors 50a and 50b) or ground (sources of transistors 56a2 and 56b2).

Figure 5:
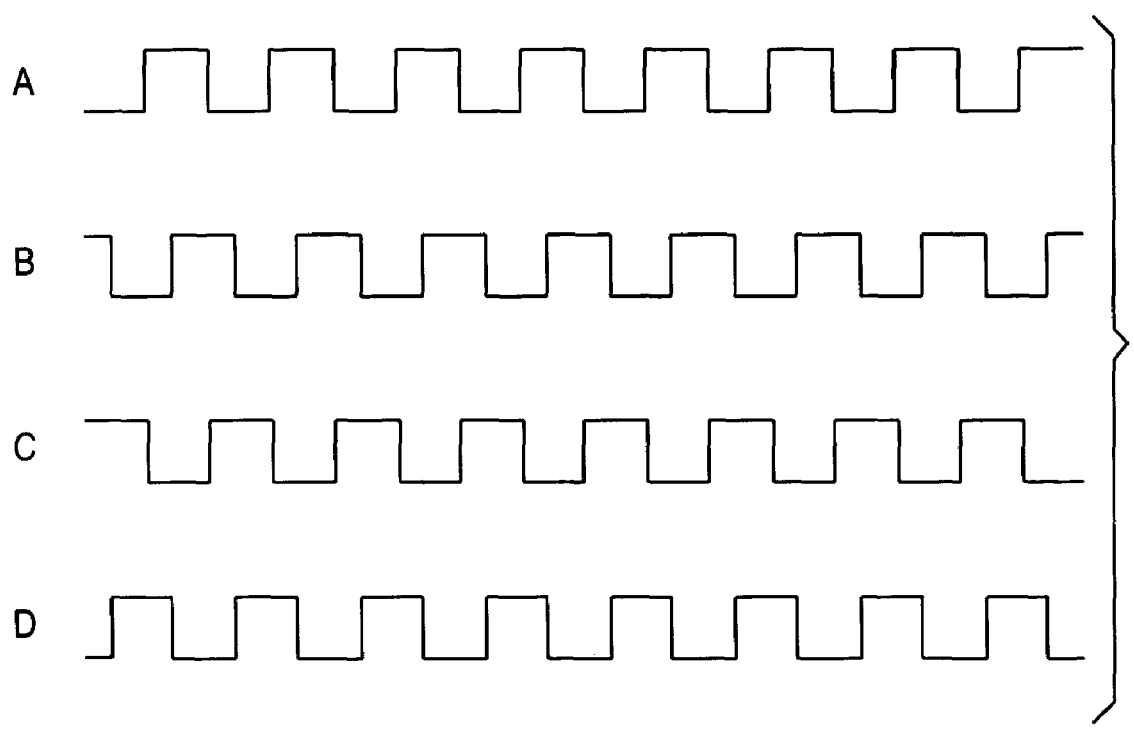
FIG. 5 shows simplified signal waveforms that are useful in explaining certain aspects of the invention.

FIG. 5 shows the signals on the leads labeled A-D in FIG. 3 plotted against a common horizontal time base. Note that these signals A-D are in phase quadrature with one another. In other words, the phases of these signals are 90° apart, so that the phases of these four signals divide one full 360° cycle of a clock signal having the frequency shown in FIG. 5 into four equal parts.

Figure 7:
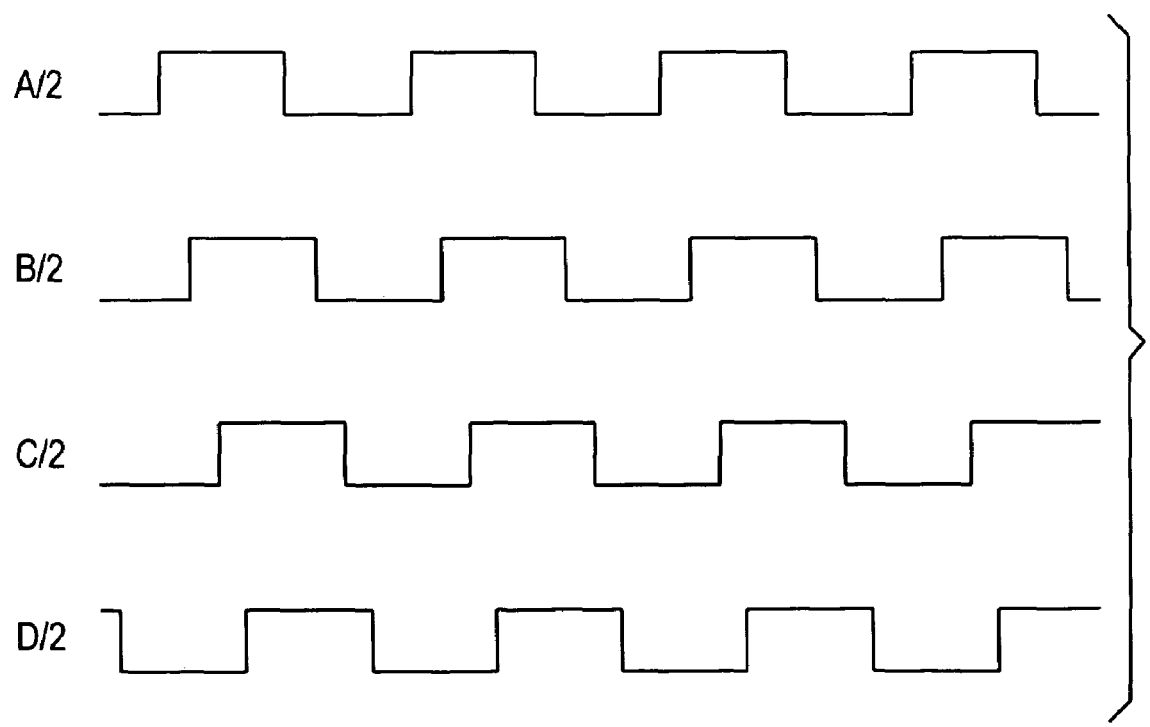
FIG. 7 shows more simplified signal waveforms that are useful in explaining aspects of the invention.
Figure 6:
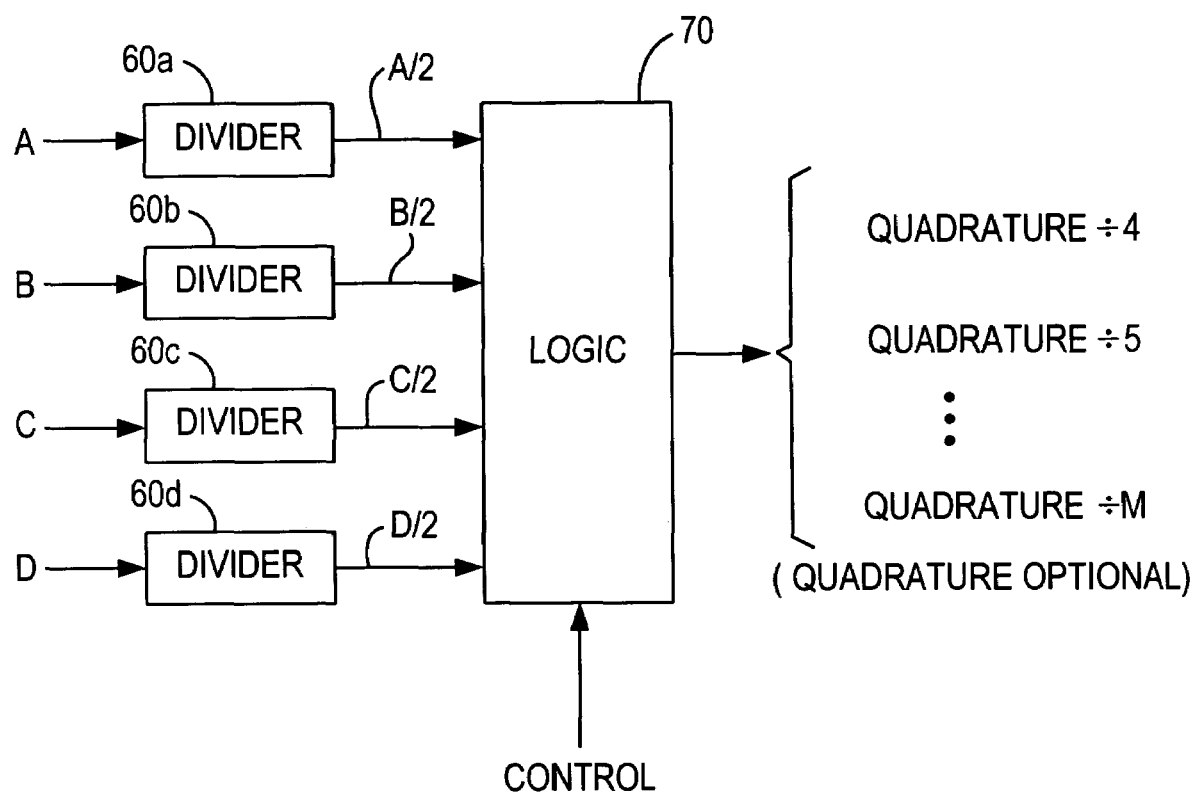
FIG. 6 is a simplified block diagram of an illustrative embodiment of another portion of circuitry of the type shown in FIG. 1 in accordance with the invention.

An illustrative embodiment of multi-modulus divider 30 (FIG. 1) is shown in more detail in FIG. 6. As shown in this Figure, each of quadrature signals A-D is applied to a respective one of frequency divider circuits 60a-60d. Each of circuits 60 divides the frequency of the signal applied to it by 2. The resulting frequency-divided signals A/2 through D/2 are plotted in FIG. 7 against the same horizontal time base that was used in FIG. 5. Note that the phase spacing (in terms of time delay) remains the same from FIG. 5 to FIG. 7.

FIG. 6 further shows that signals A/2 through D/2 are applied to logic circuitry 70. Logic circuitry 70 uses various features of signals A/2 through D/2 to effectively synthesize one or more output signals having frequency that is any of several integer fractions of the frequency of signals A-D. One or more control signals are applied to logic circuitry 70 to cause it to give circuitry 30 the desired frequency divider number or factor. For example, if it is desired for the frequency of the output signal(s) of logic 70 to be one-quarter of the frequency of LC tank VCO circuitry 20, logic 70 may be controlled to cause it to respond to every other positive-going transition in the A/2 signal by causing a positive-going transition in a related quadrature output signal, and to respond to each intervening positive-going transition in the A/2 signal by causing a negative-going transition in the related quadrature output signal. (It will be appreciated that if only division by powers of 2 is needed, then logic 70 can be replaced or implemented by simple frequency divider circuits. The illustrative embodiment being discussed, however, is the more general case that can support division by even or odd division ratios.)

As another example, if it is desired for the frequency of the output signal(s) of logic 70 to be one-fifth of the frequency of LC tank circuitry 20, logic 70 may be controlled as follows to cause it to respond to the A/2 and C/2 signals to produce an A quadrature output signal: positive-going transition in output in response to positive-going transition in A/2; ignore next positive-going transition in C/2; negative-going transition in output in response to next positive-going transition input C/2; ignore next negative-going transition in A/2; positive-going transition in output in response to next negative-going transition in A/2; ignore next negative-going transition in C/2; negative-going transition in output in response to next negative-going transition in C/2; ignore next positive-going transition in A/2; positive-going transition in output in response to next positive-going output in A/2; etc.

As still another example, if it is desired for the frequency of the output signal(s) of logic 70 to be one-sixth of the frequency of LC tank circuitry 20, logic 70 may be controlled to cause it to produce an A quadrature output signal as follows: positive-going transition in output in response to every third positive-going transition in A/2; negative-going transition in output in response to every third negative-going transition in A/2 that is midway between the above-mentioned positive-going transitions in A/2.

Figure 13:
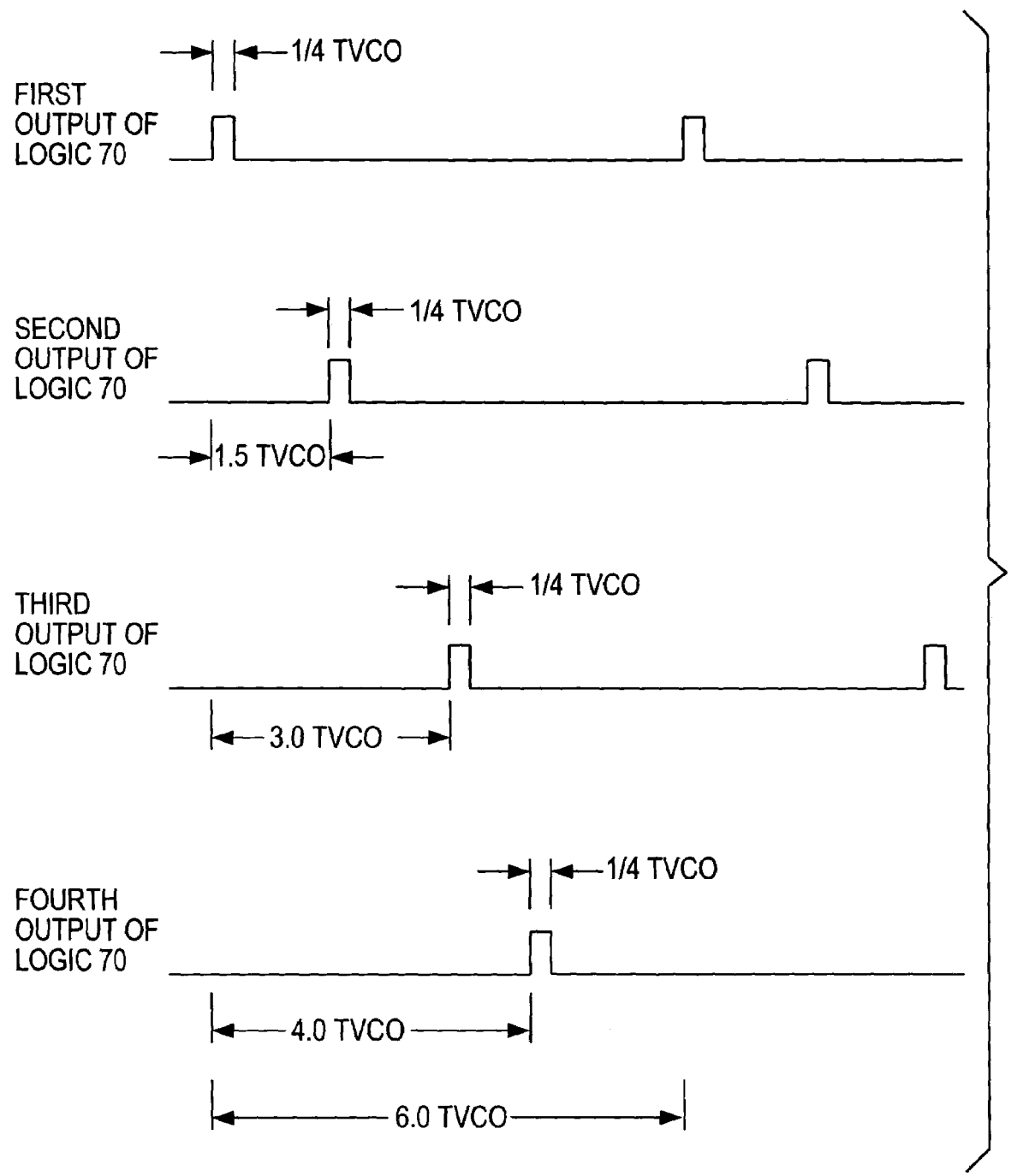
FIG. 13 is a set of illustrative signal traces that is useful in explaining certain aspects of the invention.

It will be apparent from the foregoing how logic 70 can be set up and controlled to provide an output signal having frequency that is any one of many different integer fractions of the frequency of LC tank circuitry 20. It will also be apparent from the foregoing that logic 70 can have multiple output signals, that can have various phases relative to one another. Although such multiple output signals of logic 70 can be such that they all have the same frequency and are in phase quadrature relative to one another (as is suggested by the legends along the right-hand side of FIG. 6), this is not necessarily the case. For example, if desired, the frequencies of these signals can be different (as a result of logic 70 using different divisors to produce different ones of these signals), and/or the phase differences among them can be different than quadrature. This is all possible because these signals are "built" by use of logic circuits 70 to form desired waveforms as allowed by the input signal (A/2-D/2) resolution. For a given division ratio, all output signals have the same frequency. The duty cycle and relative phase of each output signal can be set arbitrarily following the phase resolution of signals A/2, B/2, C/2, and D/2, and the phase relation as defined by signals A, B, C, and D (90° distance at VCO frequency, which distance may be defined as 0.25 TVCO). One set of logic 70 output signals that is of particular interest is a set that contains quadrature signals. For quadrature signals, the waveforms at each output will be offset by one quarter of the synthesized frequency period. But, as has been said, quadrature is only an example, and non-quadrature is equally possible, as is illustrated by FIG. 13 (in which the fourth signal is not in quadrature with the other signals). FIG. 13 also illustrates that the output signals of logic 70 can have duty cycles other than 50%. In general, the numerator of the duty cycle fraction can be any integer multiple of the time delay between any two phase-adjacent ones of signals A/2-D/2 (i.e., 0.25 TVCO). In the example shown in FIG. 13, this integer multiple is 1 for all four signals. The denominator in the duty cycle fraction is the period of the synthesized output signal (6.0 TVCO for all of the signals shown in the FIG. 13 example). The phase spacing among multiple logic 70 output signals can also be any integer multiple of 0.25 TVCO. In the example shown in FIG. 13, these integer multiples of 0.25 TVCO are 6, 12, and 16 for the second, third, and fourth signals relative to the first signal.

To briefly review the operation of logic 70, in the general case in which the overall frequency division of circuitry 30 is by any integer value such as 4, 5, 6, 7, etc., logic 70 is frequency modification circuitry that can effectively add 2, 3, 4, 5, etc., to the frequency division by 2 that has already been performed by dividers 60. In the simpler case in which the overall frequency division factor can only be a power of 2 (e.g., 4, 8, etc.), the additional frequency modification performed by logic 70 can be simple frequency division by 2, 4, etc., and logic 70 can be replaced or implemented by simple frequency divider circuitry. But in the more general case, logic 70 operates more like a frequency synthesizer to produce output signals derived from particular features of the input signals and to thereby effectively increase the overall frequency division factor (from the value of 2 provided by dividers 60) by an additional integer value of 2, 3, 4, 5, etc.

Figure 8:
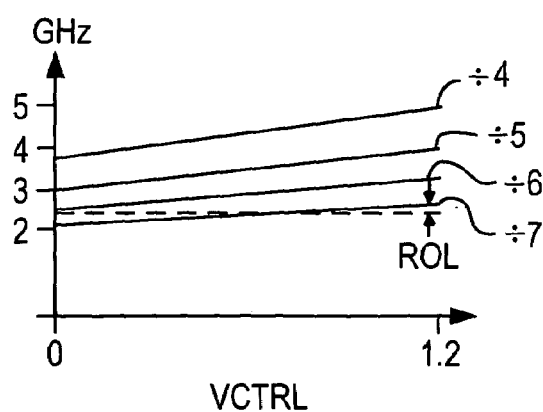
FIG. 8 is a simplified graph of more frequency-vs.-control-voltage circuit behaviors that are useful in explaining aspects of the invention.

From the foregoing it will be apparent that LC tank VCO circuitry 20 is operated at several times the desired output signal frequency (i.e., the frequency output by logic 70). Indeed, in the examples discussed herein, this multiple is at least 4. This has several advantages that have already been mentioned (e.g., small LC component size and therefore reduced integrated circuit area, and reduced power consumption). Another advantage of this approach in accordance with the invention is that it makes possible VCO circuitry 10 that is operable over a wide frequency range, while allowing LC tank VCO circuitry 20 itself to operate in a relatively narrow frequency range. This is illustrated, for example, by FIG. 8, which shows the output frequency of circuitry 10 for various integer fractions of the frequency of LC tank VCO circuitry 20 in response to VCTRL (e.g., as in FIG. 2). The starting and ending points for the various lines shown in FIG. 8 are approximately as follows:

| Divisor | Start (GHz) | End (GHz) |
|---------|-------------|-----------|
| 4 | 3.75 | 5.0 |
| 5 | 3.0 | 4.0 |
| 6 | 2.5 | 3.3 |
| 7 | 2.1 | 2.8 |

Note that the various ranges in the above table have overlapping starting/ending points, so that by changing both VCTRL and the divisor parameter, any desired frequency within the wide range from about 2.1 GHz to about 5.0 GHz can be produced. (An example of the above-mentioned range overlap is shown (at "ROL") for the lowest two frequency ranges in FIG. 8.) Moreover, this 2.1-5.0 GHz range is achieved while operating LC tank VCO circuitry 20 within a relatively narrow frequency band (e.g., from 15 to 20 GHz (i.e., a band in which the highest frequency is only about 33% higher than the lowest frequency)). It is desirable to operate circuitry 20 in such a small frequency range because this helps hold down phase noise throughout the entire operating range of the circuitry as a whole.

Yet another advantage of using divided down signals is that division by an integer number N improves the resulting waveform phase noise by approximately $20 \log_{10} N$, and VCO jitter relative to output period (unit interval or UI) is reduced by a factor of approximately N.

Figure 9:
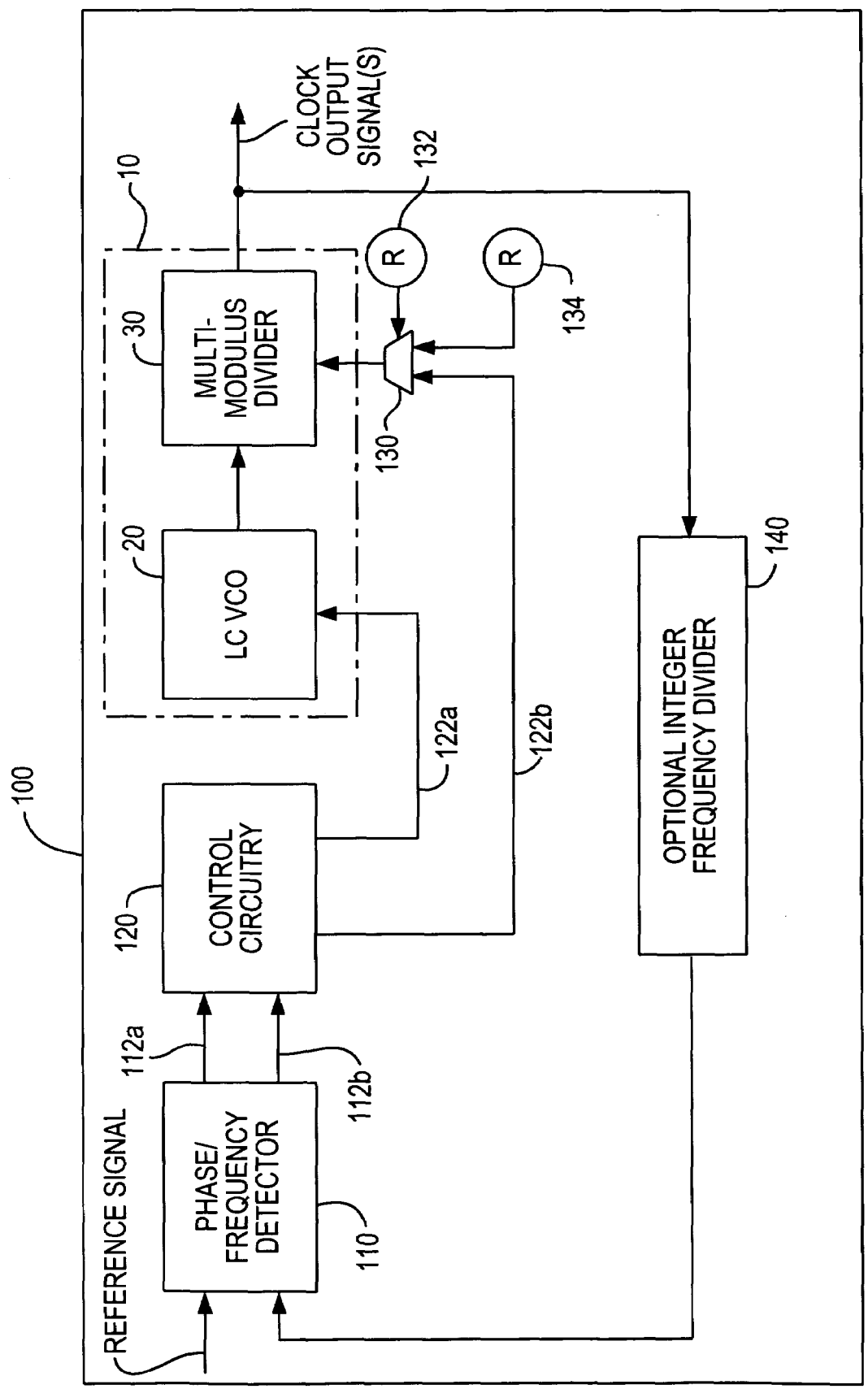
FIG. 9 is a simplified schematic block diagram of illustrative circuitry that can include VCO circuitry in accordance with the invention.

FIG. 9 shows an illustrative context in which VCO circuitry of the type described above may be employed. This context is a programmable logic device ("PLD") or field programmable gate array ("FPGA") integrated circuit device 100.

The circuitry shown in FIG. 9 has two basic modes of operation. In one of these modes the frequency dividing factor employed by divider circuitry 30 (e.g., as in FIG. 1) is selectable but programmed into memory cells (e.g., RAM cells) 134 on device 100. In the other mode the frequency dividing factor employed by divider circuitry 30 is output by control circuitry 120. Multiplexer circuitry 130 is programmably controlled by RAM cell 132 to allow divider circuitry 30 to get its frequency dividing factor from either RAM cells 134 or from control circuitry 120. In the former case the frequency dividing is basically fixed once it has been selected and programmed into RAM cells 134. This case may be used when it is known that the reference signal (described below) will always have a frequency within a range of frequency variation achievable by LC VCO circuitry 20 (e.g., as in FIG. 1) after division by the fixed frequency dividing factor. The second case (frequency dividing factor from control circuitry 120) may be used when it may be necessary to vary both the frequency of LC VCO 20 and the frequency dividing factor employed by divider circuitry 30 to produce a VCO 10 output signal or signals having frequency that corresponds in the desired manner to the reference signal frequency. This latter mode of operation of the FIG. 9 circuitry will be discussed first in the following paragraphs. Then the fixed frequency dividing factor case will be briefly mentioned again.

Device 100 may receive a clock-type reference signal from an external source (not shown). This reference signal is one input to phase/frequency detector ("PFD") circuitry 110. The other input to PFD 110 is an output signal of multi-modulus divider circuitry 30, possibly after frequency division by optional integer frequency divider circuitry 140. Use of circuitry 140 allows the reference signal to have a lower frequency. The second input to PFD 110 (described in the preceding sentence) may be referred to as the feedback signal. PFD 110 determines whether transitions in the reference signal are ahead of or behind transitions in the feedback signal. This is an indicator of whether the frequency of VCO 10 needs to be increased or decreased to produce frequency correspondence (and possibly also phase correspondence) between the reference and feedback signals. Signals indicating a need to increase the frequency of VCO 10 may be output on lead(s) 112*a*; signals indicating a need to decrease the frequency of VCO 10 may be output on lead(s) 112*b*.

Control circuitry 120 receives the output signals of PFD 110 and determines whether these signals indicate a net need to increase or decrease the frequency of VCO 10. Control circuitry 120 also determines whether the currently needed frequency increase or decrease can be effected by increasing or decreasing the frequency of LC VCO circuitry 20, or if the frequency divider factor currently being employed by divider circuitry 30 must be changed in order to effect this VCO 10 frequency increase or decrease. For example, if the currently needed frequency change may be achievable by changing VCTRL (FIG. 2 or FIG. 8) without violating acceptable upper or lower limits on the value of VCTRL, then control circuitry 120 may change VCTRL via lead(s) 122*a*. The frequency dividing factor (e.g., on leads 122*b*) is not changed by control circuitry 120. On the other hand, if an upper or lower limit on the value of VCTRL is going to be violated, then control circuitry 120 changes the frequency dividing factor used by divider circuitry 30 in a direction that also preferably allows VCTRL to be moved away from the upper or lower limit that is about to be violated. Thus when control circuitry 120 changes the frequency dividing factor via leads 122*b*, it may also change VCTRL (via lead(s) 122*a*) in what may be called the opposite direction to avoid too abrupt a change in the VCO 10 output frequency in response to the change in frequency dividing factor.

Components 10, 20, and 30 in FIG. 9 operate as has been described earlier in this specification.

Returning briefly to the mode in which multiplexer 130 is programmably controlled by RAM cell 132 to apply a selectable but basically fixed frequency dividing factor from RAM cells 134 to divider circuitry 30, in that case control circuitry 120 can only change the frequency output by VCO 10 by changing VCTRL and therefore the frequency of LC VCO circuitry 20. As has been said, this mode of operation can be used when the frequency of the reference signal is basically known (e.g., known that it will always stay within a range reachable only by varying VCTRL, while using a particular, fixed frequency dividing factor).

In another possible embodiment, signals (like those from RAM cells 134 or on leads 122*b*) for controlling the frequency dividing factor employed by circuitry 30 may come from a source external to device 100. This may be a further choice selectable by programmably controlled multiplexer circuitry like circuitry 130 in FIG. 9.

As has been mentioned, the VCO employed in accordance with the invention does not have to be based on use of an LC tank oscillator circuit. Other types of oscillator circuits can be used instead, if desired. For example, the oscillator circuit can be a ring oscillator circuit. A differential, two-stage, cross-coupled ring oscillator can be produced by omitting inductor 52 from the circuitry shown in FIG. 4. But this is only one example, and a suitable ring oscillator can also be constructed in other known ways. (Inductor 52 does help the FIG. 4 circuit operate at higher frequencies and with better phase noise, but it can be omitted as has been explained.)

Figure 10:
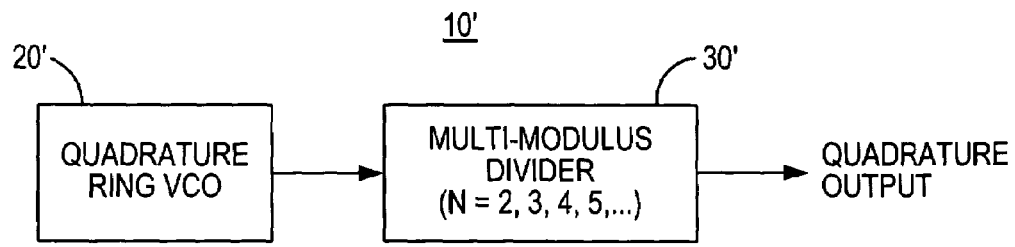
FIG. 10 is similar to FIG. 1, but shows another illustrative embodiment in accordance with the invention.

FIG. 10 shows an illustrative alternative 10' to FIG. 1 which employs quadrature ring VCO 20' and modified multi-modulus divider 30'. These elements can be generally similar to the FIG. 1 elements, except that oscillator 20' is a ring oscillator rather than an LC tank oscillator, and divider 30' includes frequency division by 2 and 3, as well as by higher integer factors.

Figure 11:
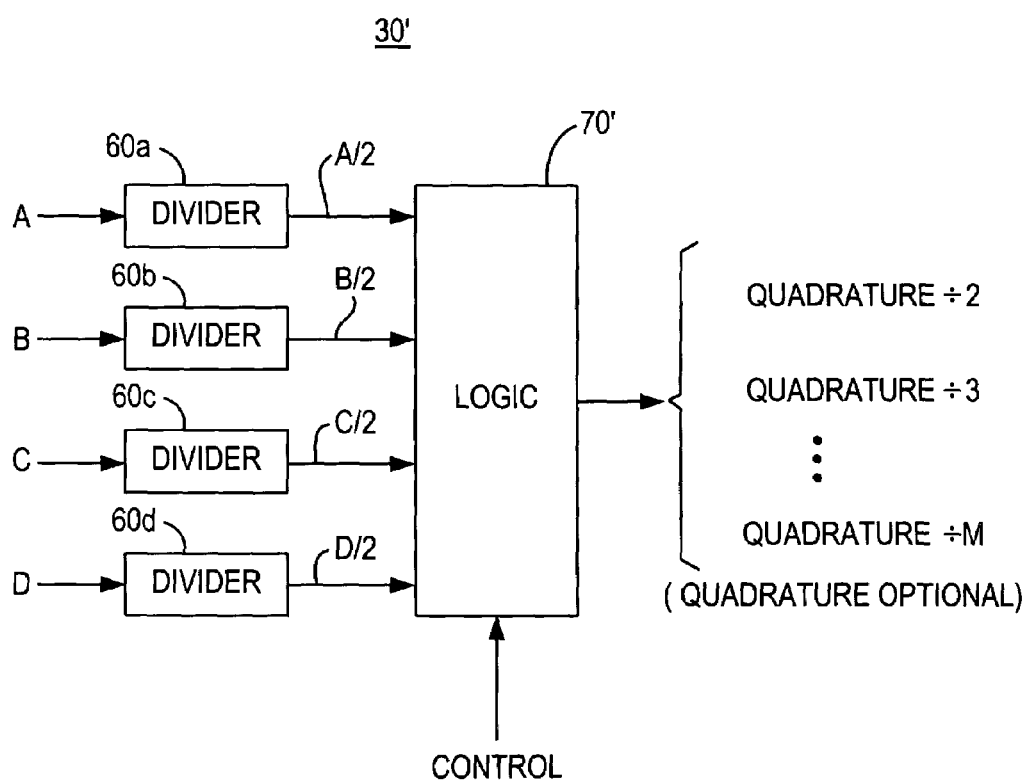
FIG. 11 is similar to FIG. 6 for the alternative embodiment shown in FIG. 10.

FIG. 11 shows an illustrative embodiment of divider 30'. This can be similar to what is shown in FIG. 6, except that in FIG. 11 logic 70' has the following additional capabilities: (1) it can pass through, unaltered, the outputs of dividers 60 to produce overall frequency division by 2; or (2) it can effectively synthesize from the A/2-D/2 signals output signals that have frequency equal to the frequency of signals A-D divided by 3.

Figure 12:
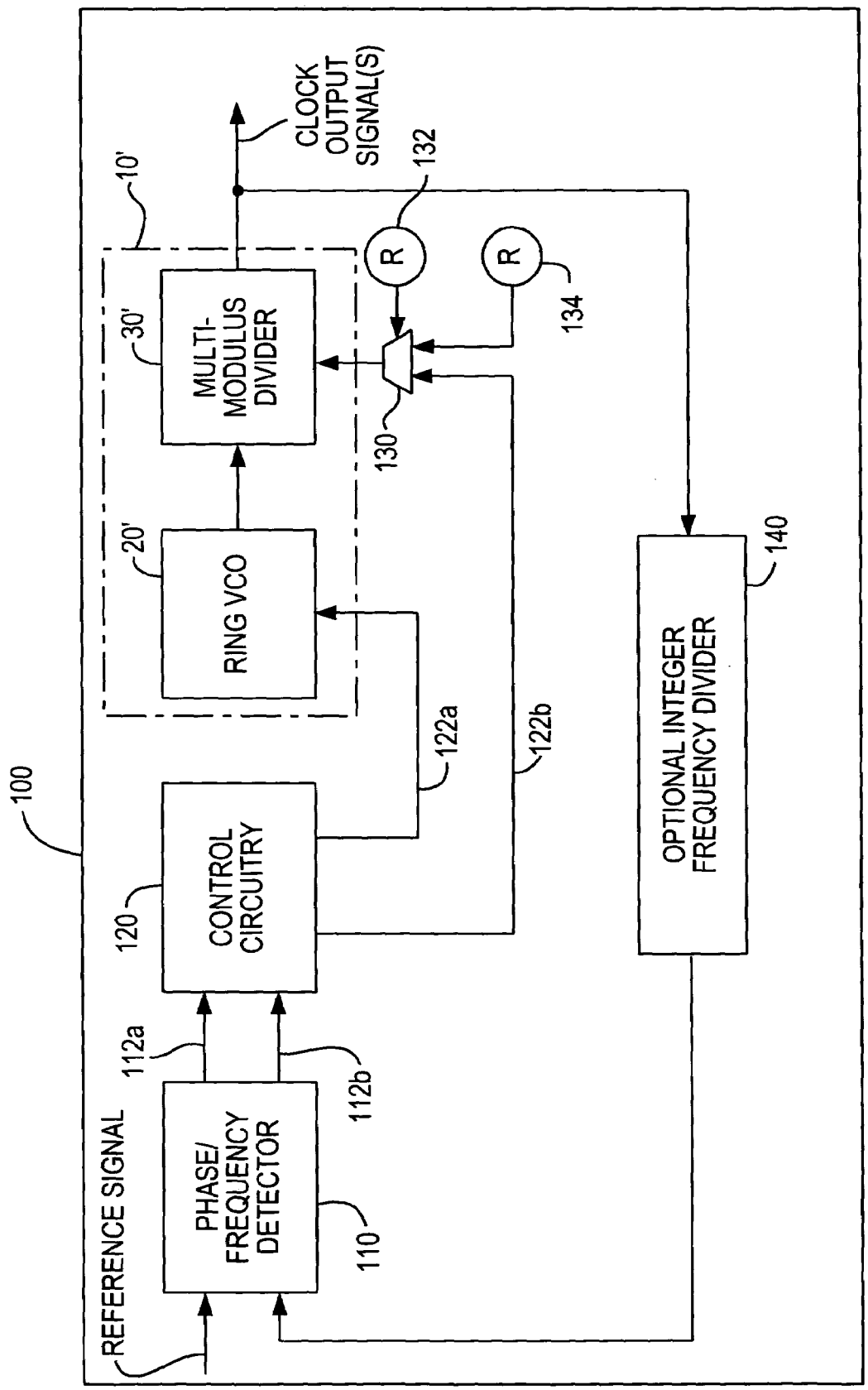
FIG. 12 is similar to FIG. 9 for the alternative embodiment shown in FIG. 10.

FIG. 12 is similar to FIG. 9, but shows use of ring oscillator alternative 10' from FIG. 10 instead of LC tank oscillator 10 as in FIG. 1.

In all respects other than those specifically mentioned above, the ring oscillator alternative of FIGS. 10-12 can be similar to what is described earlier in connection with FIGS. 1-9.

Figure 14:
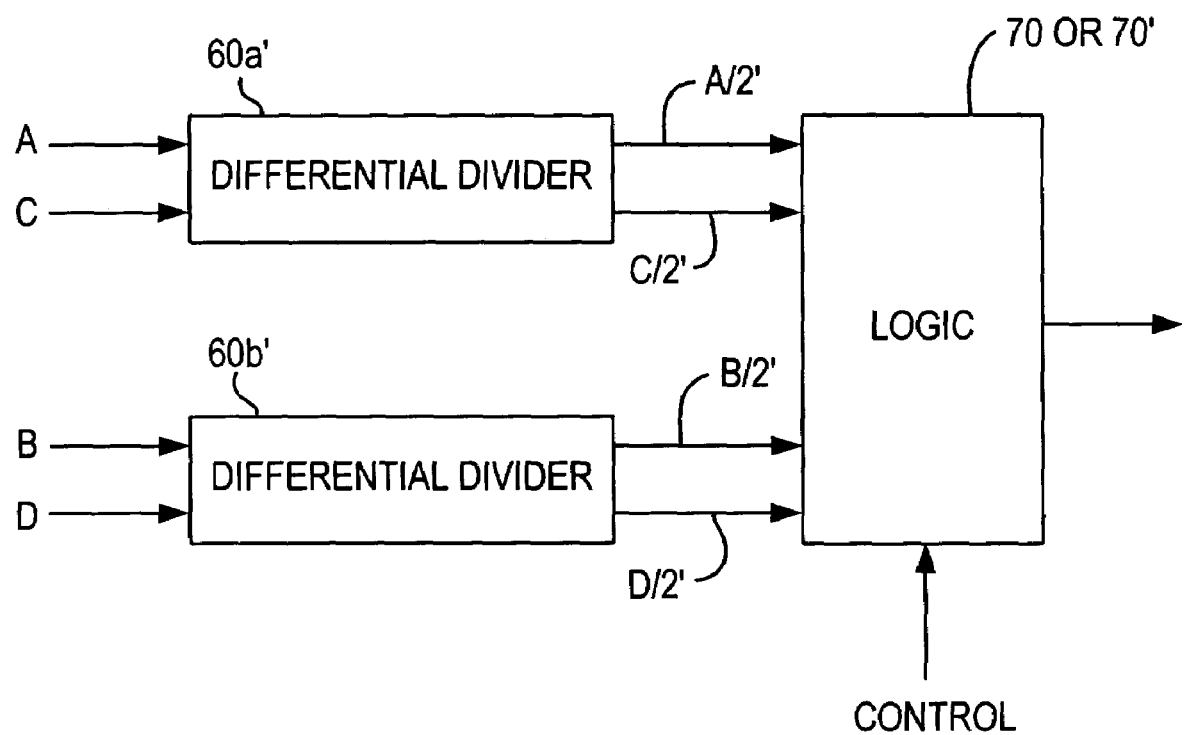
FIG. 14 is a simplified block diagram showing an illustrative, possible modification of FIG. 6 or FIG. 11 in accordance with the invention.

The embodiments shown and described above include four "single-ended" frequency dividers 60*a-d* and logic 70/70' that is described as being able to operate on both rising and following edges of the applied signals A/2-D/2. Features like this help give the circuitry great generality of operation, including the ability to (1) divide the frequency of the VCO by even and odd divisors, (2) provide output signals with a wide range of duty cycles (i.e., 50% duty cycle and non-50% duty cycle, whether the frequency divisor is even or odd), and (3) provide output signals that have quadrature or a wide range of non-quadrature phase relationships to one another. If, however, not all of these capabilities are required, then alternative embodiments of the invention may include various simplifications. One example of such possible simplification is shown in FIG. 14. This involves use of two differential divider circuits 60*a'* and 60*b'* to replace single-ended divider circuits 60*a-d* in embodiments that are otherwise like those shown in FIG. 6 or FIG. 11. Differential dividers 60*a'* and 60*b'* do not preserve the finer 0.25 TVCO phase spacing of signals A-D when producing signals A/2'-D/2'. Thus they take away some of the greater generality of the earlier-described embodiments. Nevertheless, the remaining capabilities of the circuitry may be sufficient for many purposes.

Another example of possible simplifications is elimination of one or two of dividers 60*a*-60*d* in embodiments like those illustrated by FIG. 6 or FIG. 11. Again, this will mean loss of some (or possibly all) of the finer 0.25 TVCO information that is available in signals A/2-D/2 in the FIG. 6 and FIG. 11 embodiments, but the remaining capabilities may be sufficient for some useful purposes.

Figure 15:
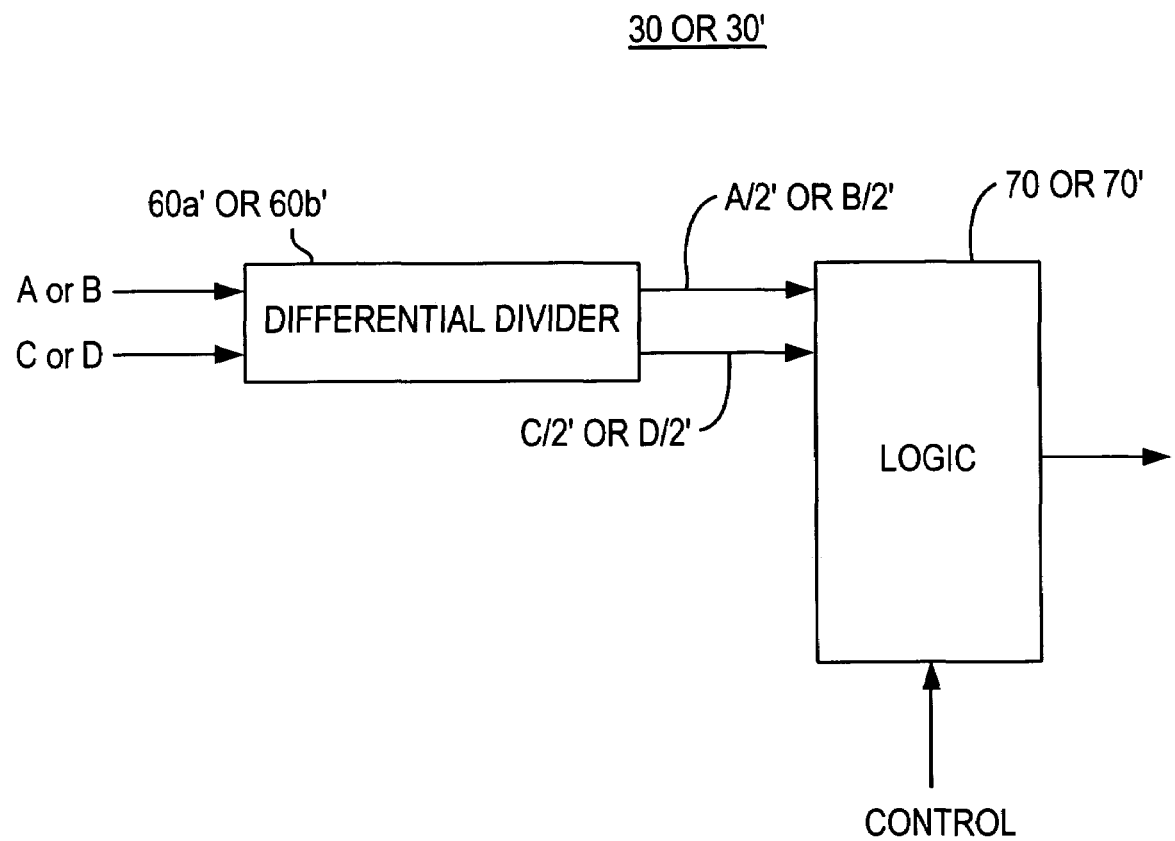
FIG. 15 is similar to FIG. 14 for another illustrative, possible modification in accordance with the invention.
Figure 16:
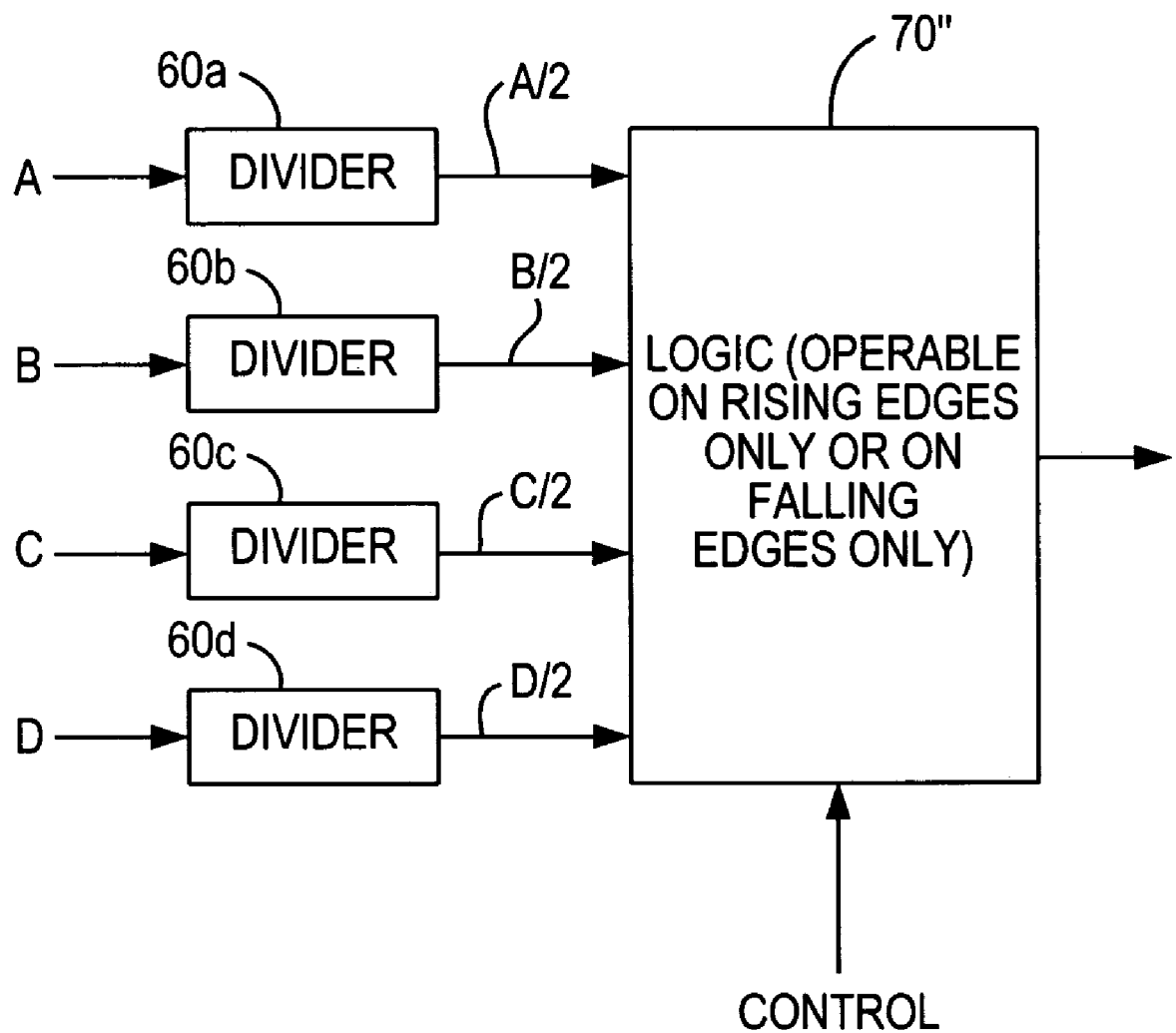
FIG. 16 is again similar to FIG. 14 for yet another illustrative, possible modification in accordance with the invention.

A possible further simplification of embodiments like those illustrated by FIG. 14 is elimination of one of the two differential dividers 60*a/b'* as shown in FIG. 15. Still another example of a possible simplification is equipping logic 70/70' to operate only on rising edges or only on falling edges in the signals applied to it as shown in FIG. 16.

Simplifications of the various kinds described above may be used in various combinations. Again, employment of these various simplifications may reduce the generality of circuit operation in various respects (e.g., relating to whether odd as well as even frequency divisors can be supported, whether arbitrary output signal duty cycles can be provided, and/or whether quadrature and arbitrary non-quadrature output signals can be provided). However, the effects of these various simplifications may be acceptable in many applications, and so a selection of one or more of these simplifications may be made, consistent with the objectives that need to be satisfied in particular cases or classes of cases.

VCOs in accordance with the invention can be used substantially anywhere that a conventional VCO might be used. The following discussion of another possible use of this circuitry is not to be understood as in any way limiting the general usability of the circuitry.

Embodiments of this invention, especially those that can produce an arbitrary waveform of 0.25 TVCO resolution, may replace conventional delay matching circuitry. A delay matching circuit is typically achieved by introducing an active buffer (or inverter circuit) in a signal path. In this manner, delays associated with circuit architecture and delays caused by layout-related parasitics are compensated. An arbitrary value or amount of delay can be obtained in this manner. The amount of this delay is, however, highly sensitive to process and environment parameters (e.g., supply voltage and temperature variations).

Instead of using conventional delay circuitry, a delay of a clock signal (e.g., of 0.25 TVCO or any integer multiple thereof) can be readily obtained from circuitry 10 or 10' in accordance with this invention. For example, for a VCO 20 or 20' operating at 20 GHz, 0.25 TVCO equals 12.5 ps (picoseconds). Clocks with this delay can readily be obtained at a desired frequency, e.g., 0.5 fVCO. In this example, the obtained resolution amounts to 12.5 ps/100 ps=⅛ UI, where UI is the period of data transmission (unit interval; 100 ps in this example).

It will be understood that the foregoing is only illustrative of the principles of the invention, and that various modifications can be made by those skilled in the art without departing from the scope and spirit of the invention. For example, the various frequencies mentioned herein are only illustrative, and other frequencies can be used instead if desired. As another example of modifications within the scope of the invention, the various aspects of the invention are not limited to the particular types of VCOs shown herein (e.g., the particular type of LC VCO shown). Any narrowband-like VCO can benefit from the techniques of this invention. A narrowband VCO is a VCO operable between a relatively high frequency and a relatively low frequency, the relatively high frequency being less than twice the relatively low frequency. This means that the VCO cannot provide continuous frequency coverage below the relatively low frequency by dividing the frequency of the VCO output signal by 2. In other words, after the relatively low frequency of the VCO is reached, dividing the relatively high frequency by 2 results in a frequency gap below the relatively low frequency that cannot be served by the VCO. In accordance with this invention, this problem of a frequency coverage gap can be avoided by providing a VCO that operates at frequencies higher than any that will actually be needed in the end-use signal, and always dividing that frequency by at least 2 (or at least 4) to produce the end-use signal.

The invention claimed is:

1. Voltage controlled oscillator circuitry comprising:
   two-stage coupled quadrature LC tank oscillator circuitry which produces four output signals that are in phase quadrature with one another; and
   frequency divider circuitry for dividing the frequency of an output signal of the two-stage coupled quadrature LC tank oscillator circuitry by a factor of at least 4, comprising:
   first frequency divider circuitry for dividing frequency of at least two of the output signals by a factor of 2; and
   second frequency modification circuitry that employs outputs of the first frequency divider circuitry to increase an overall frequency division factor of the divider circuitry from 2 by an additional integer value that is at least 2.

2. The circuitry defined in claim 1 wherein the additional integer value is selectable from a plurality of possible integer values.

3. The circuitry defined in claim 2 wherein the second frequency modification circuitry operates by synthesizing a signal from features of more than one of the outputs of the first frequency divider circuitry.

4. The circuitry defined in claim 1 further comprising:
   control circuitry for controllably varying frequency of oscillation of the LC tank oscillator circuitry.

5. The circuitry defined in claim 1 further comprising:
   control circuitry for controllably varying the factor employed by the frequency divider circuitry.

6. The circuitry defined in claim 4 wherein the control circuitry additionally controllably varies the factor employed by the frequency divider circuitry.

7. The circuitry defined in claim 1 wherein the second frequency modification circuitry further employs outputs of the first frequency divider circuitry to establish a duty cycle for an output signal of the second frequency modification circuitry.

8. The circuitry defined in claim 7 wherein the second frequency modification circuit can select the duty cycle from a plurality of possible duty cycles.

9. Voltage controlled oscillator circuitry comprising:
   ring oscillator circuitry which produces four output signals that are in phase quadrature with one another; and
   first frequency divider circuitry for dividing frequency of at least two of the output signals by a factor of 2; and
   second frequency modification circuitry that employs outputs of the first frequency divider circuitry to optionally increase an overall frequency division factor of the frequency divider circuitry from 2 by an additional integer value that is at least 1.

10. The circuitry defined in claim 9 wherein the additional integer value is selectable from a plurality of possible integer values.

11. The circuitry defined in claim 9 wherein the second frequency modification circuitry operates by synthesizing a signal from features of more than one of the outputs of the first frequency divider circuitry.

12. The circuitry defined in claim 9 further comprising:
    control circuitry for controllably varying frequency of oscillation of the ring oscillator circuitry.

13. The circuitry defined in claim 9 further comprising:
    control circuitry for controllably varying the factor employed by the frequency divider circuitry by a factor stored in memory.

14. The circuitry defined in claim 12 wherein the control circuitry additionally controllably varies the factor employed by the frequency divider circuitry.

15. The circuitry defined in claim 9 wherein the second frequency modification circuitry further employs outputs of the first frequency divider circuitry to establish a duty cycle for an output signal of the second frequency modification circuitry.

16. The circuitry defined in claim 15 wherein the second frequency modification circuitry can select the duty cycle from a plurality of possible duty cycles.

17. Circuitry for producing a delayed clock signal comprising:
    VCO circuitry for producing a plurality of phase-spaced output signals; and
    frequency divider circuitry for dividing frequency of the output signals by a factor of 2; and
    second frequency modification circuitry to optionally increase an overall frequency division factor of the clock signal synthesis circuitry from 2 by an additional integer value that is at least 1.

18. The circuitry defined in claim 17 wherein the VCO circuitry is selected from the group consisting of LC tank oscillator circuitry and ring oscillator circuitry.

* * * * *